US011740561B2

(12) United States Patent
Mehta et al.

(10) Patent No.: US 11,740,561 B2
(45) Date of Patent: Aug. 29, 2023

(54) METROLOGY SYSTEM, LITHOGRAPHIC APPARATUS, AND CALIBRATION METHOD

(71) Applicant: ASML Netherlands B.V., Veldhoven (NL)

(72) Inventors: Nikhil Mehta, Stamford, CT (US); Piotr Jan Meyer, Auburndale, MA (US)

(73) Assignee: ASML Netherlands B.V, Veldhoven (NL)

( * ) Notice: Subject to any disclaimer, the term of this patent is extended or adjusted under 35 U.S.C. 154(b) by 60 days.

(21) Appl. No.: 17/430,702

(22) PCT Filed: Jan. 28, 2020

(86) PCT No.: PCT/EP2020/052057
§ 371 (c)(1),
(2) Date: Aug. 12, 2021

(87) PCT Pub. No.: WO2020/164904
PCT Pub. Date: Aug. 20, 2020

(65) Prior Publication Data
US 2022/0197151 A1    Jun. 23, 2022

Related U.S. Application Data

(60) Provisional application No. 62/806,123, filed on Feb. 15, 2019.

(51) Int. Cl.
*G03F 7/20* (2006.01)
*G03F 7/00* (2006.01)
*G01N 21/47* (2006.01)

(52) U.S. Cl.
CPC ......... *G03F 7/70591* (2013.01); *G01N 21/47* (2013.01)

(58) Field of Classification Search
CPC ............ G03F 7/70516; G03F 7/70591; G03F 7/70633; G03F 9/7019; G03F 9/7049; G03F 9/7065; G03F 9/7088; G01N 21/47
See application file for complete search history.

(56) References Cited

U.S. PATENT DOCUMENTS

2007/0252963 A1*  11/2007  Modderman .......... G03B 27/42
                                                      355/53

FOREIGN PATENT DOCUMENTS

WO    WO 2018/001972 A1    1/2018

OTHER PUBLICATIONS

International Search Report and Written Opinion issued by the International Searching Authority in related International Patent Application No. PCT/EP2020/052057, dated May 18, 2020 (3 pgs.).

* cited by examiner

*Primary Examiner* — Peter B Kim
(74) *Attorney, Agent, or Firm* — Finnegan, Henderson, Farabow, Garrett & Dunner, LLP

(57) ABSTRACT

A lithographic apparatus includes an illumination system to produce a beam of radiation, a support to support a patterning device to impart a pattern on the beam, a projection system to project the patterned beam onto a substrate, and a metrology system that includes a radiation source to generate radiation, an optical element to direct the radiation toward a target, a detector to receive a first and second radiation scattered by the target and produce a first and second measurement respectively based on the received first and second radiation, and a controller. The controller determines a correction for the first measurement, an error between the correction for the first measurement and the first measurement, and a correction for the second measurement based on the correction for the first measurement, the second measurement, and the error. The lithographic apparatus uses the correction to adjust a position of a substrate.

16 Claims, 18 Drawing Sheets

METROLOGY SYSTEM, LITHOGRAPHIC APPARATUS, AND CALIBRATION METHOD

CROSS-REFERENCE TO RELATED APPLICATIONS

This application claims priority to International Application No. PCT/EP2020/052057, filed Jan. 28, 2020, and published as WO 2020/164904 A1, which claims priority of U.S. Provisional Patent Application No. 62/806,123, which was filed on Feb. 15, 2019. The contents of these applications are incorporated herein by reference in their entireties.

FIELD

The present disclosure relates to metrology apparatuses and systems, for example, alignment sensors for lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Alignment assemblies require precise reporting of positions of targets (e.g., alignment mark on a substrate). Accordingly there is a need to provide a method that can account for systematic changes (e.g., sensor drift) to increase and maintain the accuracy of wafer alignment processes while mitigating wafer production downtime caused by sensor calibration maintenance.

SUMMARY

In some embodiments, a lithographic apparatus comprises an illumination system configured to produce a beam of radiation, a support configured to support a patterning device configured to impart a pattern on the beam, a projection system configured to project the patterned beam onto a substrate, and a metrology system comprising a radiation source configured to generate radiation, an optical element configured to direct the radiation toward a target, a detector configured to receive a first and second radiation scattered by the target and produce a first and second measurement respectively based on the received first and second radiation, and a controller. The controller is configured to determine a correction for the first measurement, determine an error between the correction for the first measurement and the first measurement, and determine a correction for the second measurement based on the correction for the first measurement, the second measurement, and the error, whereby the lithographic apparatus uses the correction in a subsequent lithographic process to adjust a position of a substrate.

In some embodiments, a metrology system comprises a radiation source configured to generate radiation, an optical element configured to direct the radiation toward a target, a detector configured to receive a first and second radiation scattered by the target and produce a first and second measurement respectively based on the received first and second radiation, and a controller. The controller is configured to determine a correction for the first measurement, determine an error between the correction for the first measurement and the first measurement, and determine a correction for the second measurement based on the correction for the first measurement, the second measurement, and the error, whereby the lithographic apparatus uses the correction in a subsequent lithographic process to adjust a position of a substrate.

In one example, a method for calibrating a metrology system comprises directing radiation toward a target, receiving a first and second radiation scattered by the target using a detector, producing a first and second measurement respectively based on the received first and second radiation, determining a correction for the first measurement, determining an error between the correction for the first measurement and the first measurement, and determining a correction for the second measurement based on the correction for the first measurement, the second measurement, and the error.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
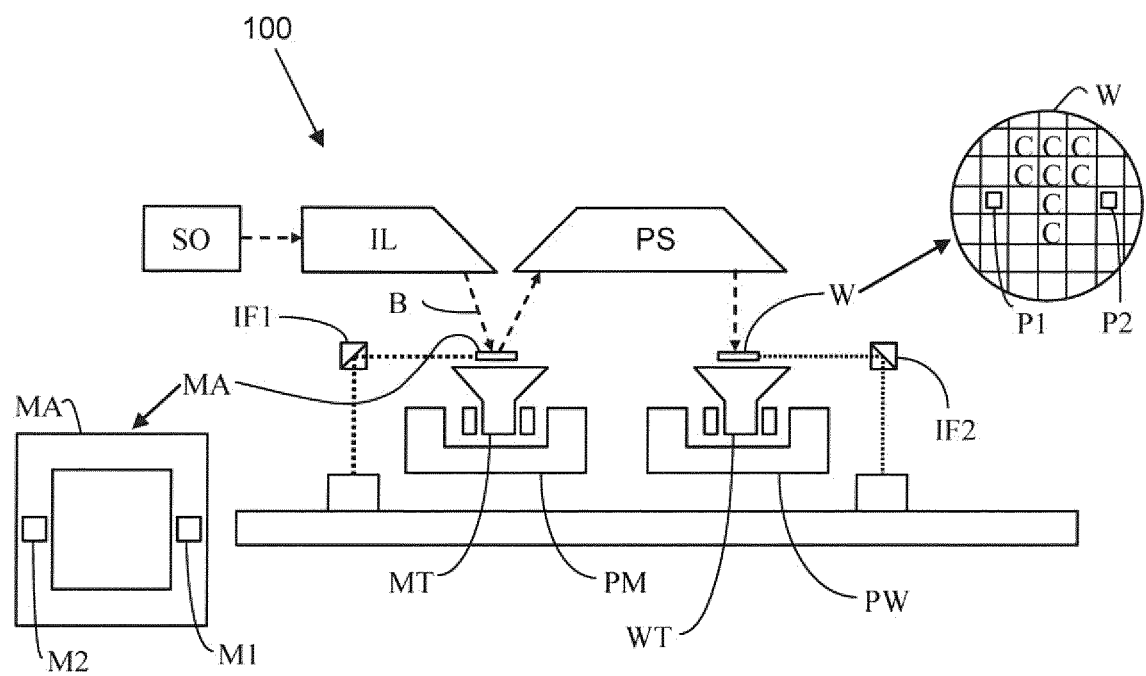
FIG. 1A shows a cross-sectional schematic of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
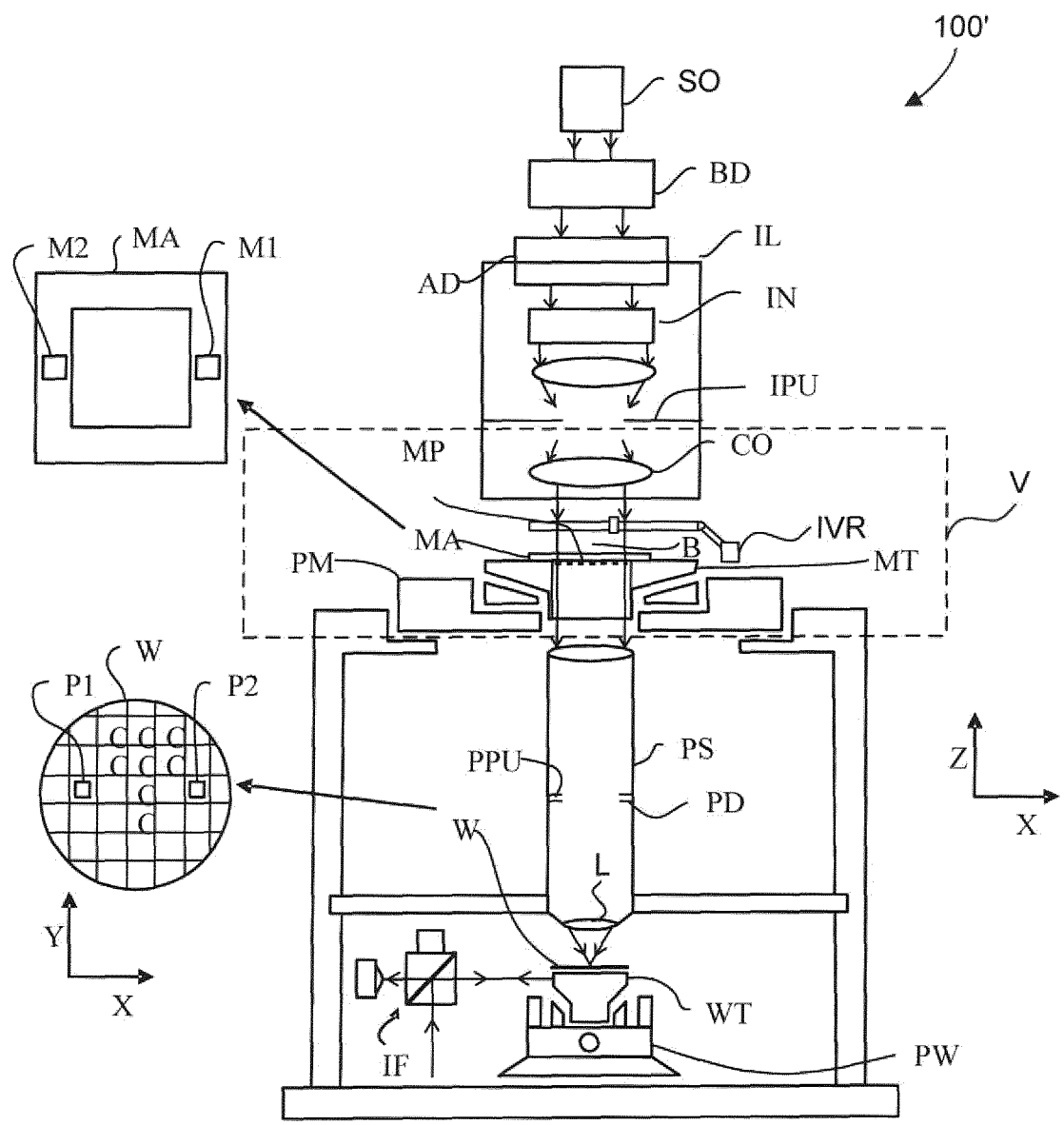
FIG. 1B shows a cross-sectional schematic of a transmissive lithographic apparatus, according to an exemplary embodiment.

FIGS. 1A and 1B are schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate can be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
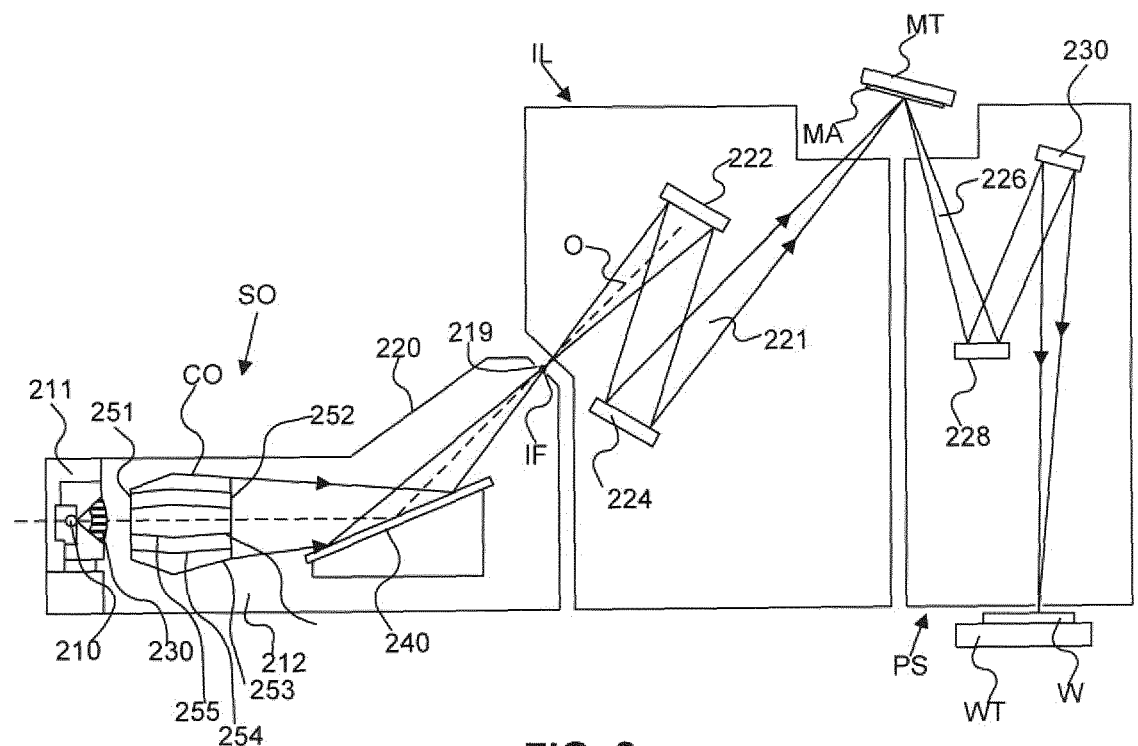
FIG. 2 shows a detailed a cross-sectional schematic of a reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Figure 3:
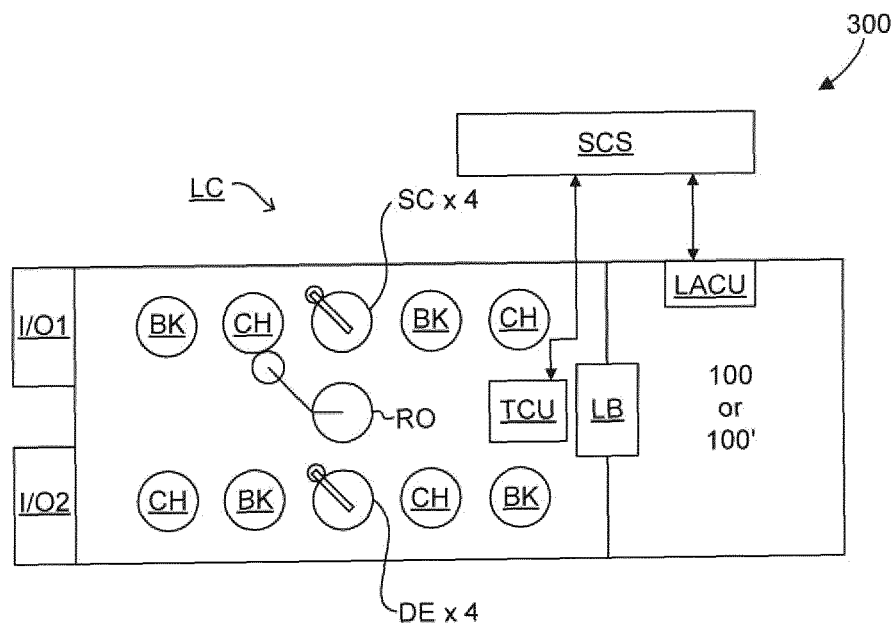
FIG. 3 shows a cross-sectional schematic of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena, such as diffraction and interference, to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated by reference herein in their entireties.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference herein in its entirety.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 4:
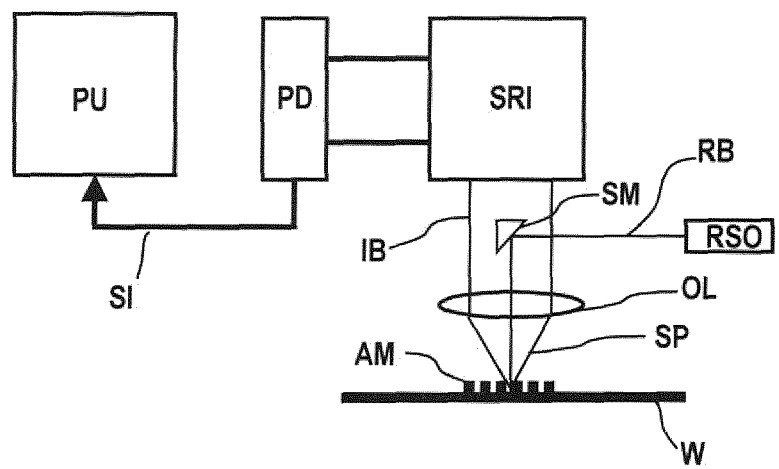
FIG. 4 shows a cross-sectional schematic of an alignment sensor, according to an exemplary embodiment.

FIG. 4 shows a cross-sectional schematic of an alignment sensor AS, according to an exemplary embodiment. A description of a similar alignment sensor can be found in, for example, U.S. Pat. No. 6,961,116, which is incorporated by reference herein in its entirety. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam M. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In some embodiments, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Figure 5:
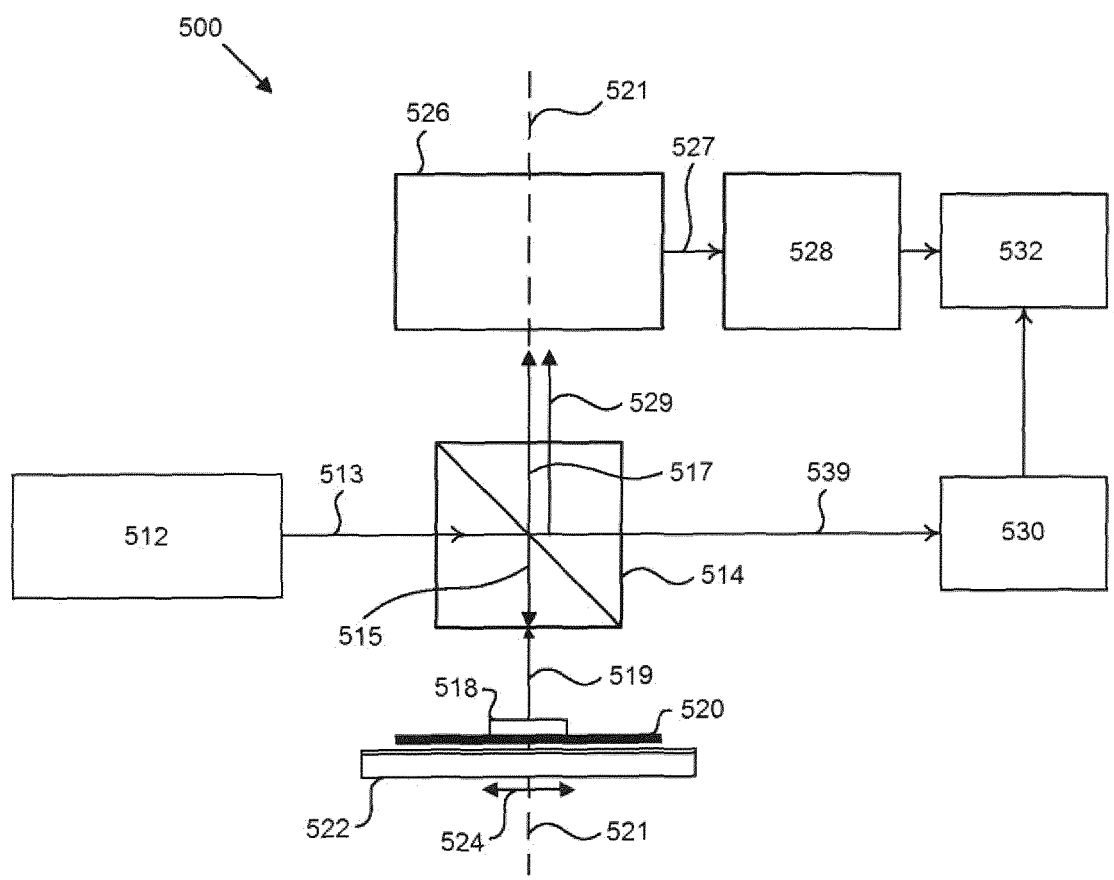
FIGS. 5 and 6 show cross-sectional schematics of alignment apparatuses, according to some exemplary embodiments.

FIG. 5 shows a cross-sectional schematic of an alignment apparatus 500 that can be implemented as a part of lithographic apparatus 100 or 100', according to an exemplary embodiment. In an example of this embodiment, alignment apparatus 500 can be configured to align a substrate (e.g., substrate W) with respect to a patterning device (e.g., patterning device MA). Alignment apparatus 500 can be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In an embodiment, alignment apparatus 500 may include an illumination system 512, a beam splitter 514, an interferometer 526, a detector 528, a beam analyzer 530, and an overlay calculation processor 532.

Illumination system 512 can be configured to provide an electromagnetic narrow band radiation beam 513 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 512 can be further configured to provide one or more passbands having substantially constant center wavelength (CWL) values over a long period of time (e.g., over a lifetime of illumination system 512). Such configuration of illumination system 512 may help to prevent the shift of the actual CWL values from the desired CWL values, as discussed above, in current alignment systems. And, as a result, the use of constant CWL values may improve long-term stability and accuracy of alignment systems (e.g., alignment apparatus 500) compared to the current alignment apparatuses.

In one example, beam splitter 514 can be configured to receive radiation beam 513 and split radiation beam 513 into at least two radiation sub-beams. In an example, radiation beam 513 can be split into radiation sub-beams 515 and 517, as shown in FIG. 5. Beam splitter 514 can be further configured to direct radiation sub-beam 515 onto a substrate 520 placed on a stage 522. In one example, the stage 522 is movable along direction 524. Radiation sub-beam 515 can be configured to illuminate an alignment mark or a target 518 located on substrate 520. Alignment mark or target 518 can be coated with a radiation sensitive film in an example of this embodiment. In another example, alignment mark or target 518 may have one hundred and eighty degrees (i.e., 180°) symmetry. That is, when alignment mark or target 518 is rotated 180° about an axis of symmetry perpendicular to a plane of alignment mark or target 518, rotated alignment mark or target 518 can be substantially identical to an unrotated alignment mark or target 518. The target 518 on substrate 520 can be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating.

One inline method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In one example, beam splitter 514 can be further configured to receive diffraction radiation beam 519 and split diffraction radiation beam 519 into at least two radiation sub-beams. In an example, diffraction radiation beam 519 can be split into diffraction radiation sub-beams 529 and 539, as shown in FIG. 5.

It should be noted that even though beam splitter 514 is shown to direct radiation sub-beam 515 towards alignment mark or target 518 and to direct diffracted radiation sub-beam 529 towards interferometer 526, the disclosure is not so limiting. It would be apparent to a person skilled in the relevant art that other optical arrangements can be used to obtain the similar result of illuminating alignment mark or target 518 on substrate 520 and detecting an image of alignment mark or target 518.

As illustrated in FIG. 5, interferometer 526 can be configured to receive radiation sub-beam 517 and diffracted radiation sub-beam 529 through beam splitter 514. In an example embodiment, diffracted radiation sub-beam 529 can be at least a portion of radiation sub-beam 515 that can be reflected from alignment mark or target 518. In an example of this embodiment, interferometer 526 comprises any appropriate set of optical-elements, for example, a combination of prisms that can be configured to form two images of alignment mark or target 518 based on the received diffracted radiation sub-beam 529. It should be appreciated that a good quality image need not be formed, but that the features of alignment mark 518 should be resolved. Interferometer 526 can be further configured to rotate one of the two images with respect to the other of the two images 180° and recombine the rotated and unrotated images interferometrically.

In some embodiments, detector 528 can be configured to receive the recombined image via interferometer signal 527 and detect interference as a result of the recombined image when alignment axis 521 of alignment apparatus 500 passes through a center of symmetry (not shown) of alignment mark or target 518. Such interference can be due to alignment mark or target 518 being 180° symmetrical, and the recombined image interfering constructively or destructively, according to an example embodiment. Based on the detected interference, detector 528 can be further configured to determine a position of the center of symmetry of alignment mark or target 518 and consequently, detect a position of substrate 520. According to an example, alignment axis 521 can be aligned with an optical beam perpendicular to substrate 520 and passing through a center of image rotation interferometer 526. Detector 528 can be further configured to estimate the positions of alignment mark or target 518 by implementing sensor characteristics and interacting with wafer mark process variations.

In a further embodiment, detector 528 determines the position of the center of symmetry of alignment mark or target 518 by performing one or more of the following measurements:
1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 530 can be configured to receive and determine an optical state of diffracted radiation sub-beam 539. The optical state can be a measure of beam wavelength, polarization, or beam profile. Beam analyzer 530 can be further configured to determine a position of stage 522 and correlate the position of stage 522 with the position of the center of symmetry of alignment mark or target 518. As such, the position of alignment mark or target 518 and, consequently, the position of substrate 520 can be accurately known with reference to stage 522. Alternatively, beam analyzer 530 can be configured to determine a position of alignment apparatus 500 or any other reference element such that the center of symmetry of alignment mark or target 518 can be known with reference to alignment apparatus 500 or any other reference element. Beam analyzer 530 can be a point or an imaging polarimeter with some form of wavelength-band selectivity. In an embodiment, beam analyzer 530 can be directly integrated into alignment apparatus 500, or connected via fiber optics of several types: polarization preserving single mode, multimode, or imaging, according to other embodiments.

In some embodiments, beam analyzer 530 can be further configured to determine the overlay data between two patterns on substrate 520. One of these patterns can be a reference pattern on a reference layer. The other pattern can be an exposed pattern on an exposed layer. The reference layer can be an etched layer already present on substrate 520. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 520 by lithographic apparatus 100 or 100'. The exposed pattern on substrate 520 may correspond to a movement of substrate 520 by stage 522. In some embodiments, the measured overlay data may also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 530 can be further configured to determine a model of the product stack profile of substrate 520, and can be configured to measure overlay, critical dimension, and focus of target 518 in a single measurement. The product stack profile contains information on the stacked product, such as alignment mark, target 518, or substrate 520, and may include mark process variation-induced optical signature metrology that is a function of illumination variation. The product stack profile may also include product grating profile, mark stack profile, and mark asymmetry information. An example of beam analyzer 530 is Yieldstar™, manufactured by ASML, Veldhoven, The Netherlands, as described in U.S. Pat. No. 8,706,442, which is incorporated by reference herein in its entirety.

Beam analyzer 530 can be further configured to process information related to a particular property of an exposed pattern in that layer. For example, beam analyzer 530 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 530, and allows the possibility of accurate stack profile detection as discussed below. For example, detector 528 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 6:
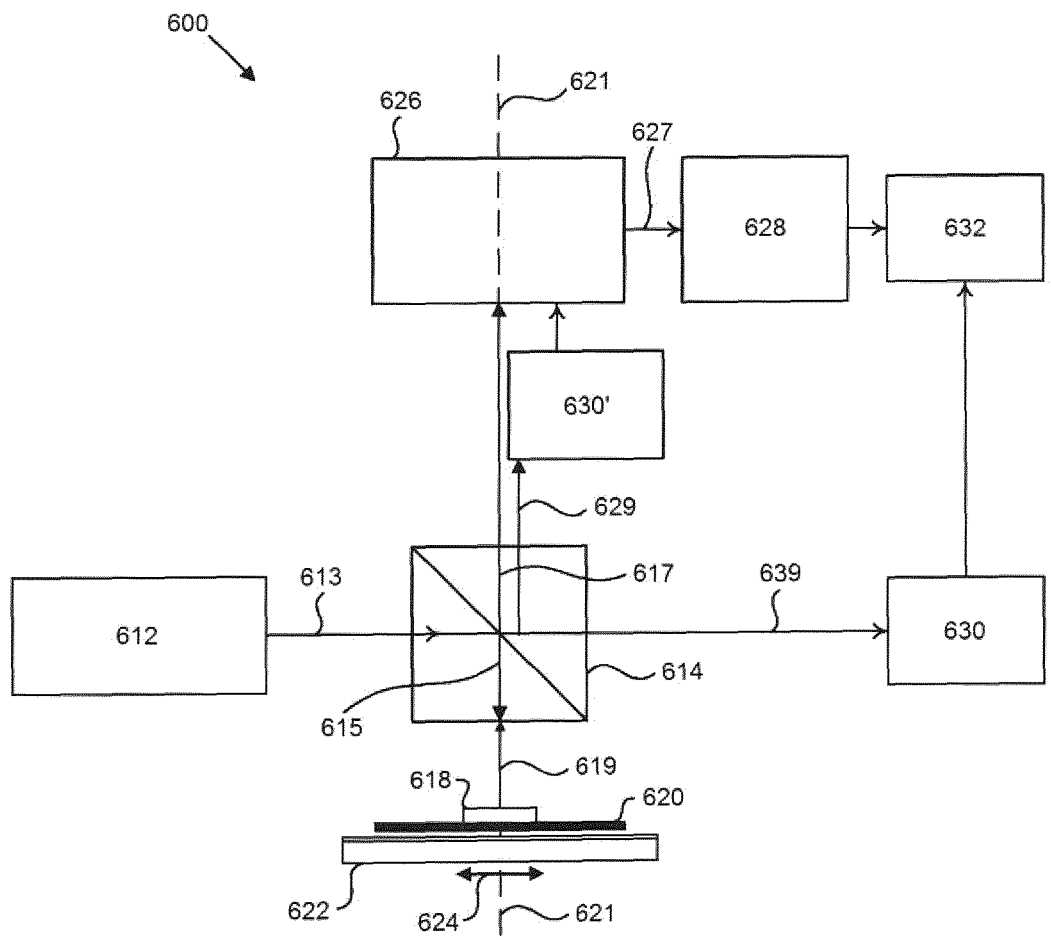

FIG. 6 illustrates a schematic of a cross-sectional view of an alignment apparatus 600 that can be implemented as a part of lithographic apparatus 100 or 100', according to an exemplary embodiment. Entities in FIG. 6 that have similar functions or properties as those in FIG. 5 are labeled with similar numbers, with the left most digit indicating the figure they belong to.

In some embodiments, a second beam analyzer 630' can be configured to receive and determine an optical state of diffracted radiation sub-beam 629, as shown in FIG. 6. The optical state can be a measure of beam wavelength, polarization, or beam profile. Second beam analyzer 630' can be identical to beam analyzer 630. Alternatively, second beam analyzer 630' can be configured to perform at least all the functions of beam analyzer 630, such as determining a position of stage 622 and correlating the position of stage 622 with the position of the center of symmetry of alignment mark or target 618. As such, the position of alignment mark or target 618 and, consequently, the position of substrate 620, can be accurately known with reference to stage 622.

Second beam analyzer 630' may also be configured to determine a position of alignment apparatus 600, or any other reference element, such that the center of symmetry of alignment mark or target 618 can be known with reference to alignment apparatus 600, or any other reference element.

Second beam analyzer 630' can be further configured to determine the overlay data between two patterns and a model of the product stack profile of substrate 620. Second beam analyzer 630' may also be configured to measure overlay, critical dimension, and focus of target 618 in a single measurement.

In some embodiments, second beam analyzer 630' can be directly integrated into alignment apparatus 600, or it can be connected via fiber optics of several types: polarization preserving single mode, multimode, or imaging, according to other embodiments. Alternatively, second beam analyzer 630' and beam analyzer 630 can be combined to form a single analyzer (not shown) configured to receive and determine the optical states of both diffracted radiation sub-beams 629 and 639.

In some embodiments, processor 632 receives information from detector 628 and beam analyzer 630. For example, processor 632 can be an overlay calculation processor. The information may comprise a model of the product stack profile constructed by beam analyzer 630. Alternatively, processor 632 may construct a model of the product mark profile using the received information about the product mark. In either case, processor 632 constructs a model of the stacked product and overlay mark profile using or incorporating a model of the product mark profile. The stack model is then used to determine the overlay offset and minimizes the spectral effect on the overlay offset measurement.

Processor 632 may create a basic correction algorithm based on the information received from detector 628 and beam analyzer 630, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 632 may utilize the basic correction algorithm to characterize the alignment apparatus 600 with reference to wafer marks and/or alignment marks 618.

In some embodiments, processor 632 can be further configured to determine printed pattern position offset error with respect to the sensor estimate for each mark based on the information received from detector 628 and beam analyzer 630. The information includes, but is not limited to, the product stack profile, measurements of overlay, critical dimension, and focus of each alignment marks or target 618 on substrate 620.

Processor 632 may utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 618 under different illumination settings, the illumination setting, which results in the smallest overlay error, and its corresponding calibration factor, can be determined and selected. Following this, processor 632 may group marks into sets of similar overlay error. The criteria for grouping marks can be adjusted based on different process controls, for example, different error tolerances for different processes.

In some embodiments, processor 632 may confirm that all or most members of the group have similar offset errors, and apply an individual offset correction from the clustering algorithm to each mark, based on its additional optical stack metrology. Processor 632 may determine corrections for each mark and feed the corrections back to lithographic apparatus 100 or 100' for correcting errors in the overlay, for example, by feeding corrections into the alignment apparatus 600.

Inline Shift Between Orders

A metrology apparatus (e.g., alignment sensor/apparatus) is relied on for its ability to report a correct position of a target. However, the reliability of a metrology apparatus can be adversely impacted when unintended changes in the metrology apparatus or its surrounding devices and systems (e.g., a lithocell) introduce unintended offsets to measured positions. Drift is an example of a systematic offset of a reported position from a true position, which forms over time. Such systematic offsets may develop due to moving parts, mechanical stress, thermal stress, coating degradation, and temperature variations, among other reasons. Drift is detrimental to the accuracy of lithographic apparatuses and processes because drift is known to have a direct 1:1 impact on machine overlay.

In order to mitigate systematic offsets, static calibrations need to be repeated often by intervening in between lot operations. A static calibration (e.g., maintenance action) is one that halts lot operations while the maintenance action is performed. Maintenance actions reduce machine availability.

A better approach is to perform calibrations inline (e.g., during lot operation) as often as is needed to estimate and compensate the evolving drift.

In some embodiments, a correction that takes drift into account may be applied to positions reported by a metrology apparatus. An inline shift between orders (ISBO) is one such correction mechanism. An ISBO measures the offset between a position reported by a given optical channel with respect to a position reported by a reference optical channel. In the context of shift between orders (SBO), the term "order" refers to an optical channel that includes, not only diffraction orders (e.g., produced by scattering radiation on a grating target), but also wavelength and polarization. An optical channel can be further distinguished by particular segments of a target that scatter the radiation toward the metrology apparatus.

Therefore, a metrology apparatus may include multiple optical channels having distinct radiation configurations. For example, an optical channel having red wavelength, $5^{th}$ diffraction order, and X-polarized radiation may be used as a reference optical channel, while other channels may use other configurations.

In an ideal metrology system, each optical channel would report identical positions of a target, and thus the difference between optical channels (e.g., SBO) would be zero. In some embodiments, however, each optical channel may report slightly different positions, which is undesirable. Moreover, each optical channel experiences random noise in addition to drift.

If a metrology system were perfectly noiseless, then the effective correction would simply be equal to the latest measured ISBO (i.e., the latest measurement is trusted with 100% confidence). But one of the difficulties in real systems is in devising methods to deal with noise. One of the goals of embodiments in the present disclosure is to reduce the effects of noise and determine an accurate SBO of a metrology system.

It was mentioned earlier that a metrology system may take ISBO measurements more frequently (e.g., in between wafer loadings) with the goal of delaying or eliminating the need for static calibrations. ISBO measurements, when performed often, may be dominated by noise because a sufficient amount of time may not have elapsed in order to perceive drift effects over the noise. A known method to treat noise is using a so-called exponential filter (or estimator). An exponential filter reduces the effects of noise by taking into account a weighted, past ISBO measurement. In some embodiments, the exponential filter can be modeled by the following equation:

$$y_n = (1-\alpha) y_{n-1} + \alpha x_n. \quad (1)$$

In EQN. 1, $y_n$ is a correction to be used at an $n^{th}$ ISBO measurement. The subscript n is a "time" index that denotes an instance or iteration of an ISBO measurement. Hence, for example, $y_{n-1}$ is a correction used in an ISBO measurement immediately prior to an $n^{th}$ ISBO measurement. $x_n$ is the $n^{th}$ ISBO measurement, and $\alpha$ is a coefficient that modifies (e.g., weighs) $y_{n-1}$ and $x_n$. The coefficient $\alpha$ is defined as $\alpha=2/(N+1)$, where N is a constant related to an equivalent moving average filter of order N (i.e., a boxcar average over N samples). N is the only adjustable (e.g., knob) parameter in EQN. 1. N may be used for tweaking the filter. Thus, EQN. 1 is an algorithm that uses knowledge of the 'history' of the metrology system and assigns weights to compute a correction estimate of an ISBO.

To better understand how the exponential filter works, let us consider an extreme case—the ideal case in which noise is absent. In this scenario, the most recent ISBO measurement should be considered trustworthy. Therefore, only the most recent measurement is needed (i.e., equivalent to setting N=1, and thus $\alpha=1$). As expected, EQN. 1 then collapses to $y_n = x_n$, which indicates that the most recent ISBO measurement is trusted with 100% confidence to provide an accurate correction.

However, when noise is introduced, a low N value reduces the averaging effects of the exponential filter. And, because averaging is a technique that treats noise, a low N value causes the filter to track noise. In contrast, a high N value, while reducing noise, causes a delayed response of the filter to an actual drift of the metrology system (this is why N may be referred to as a delay constant). A high N value is especially detrimental if the SBO experiences a sudden and substantial drift.

Figure 7:
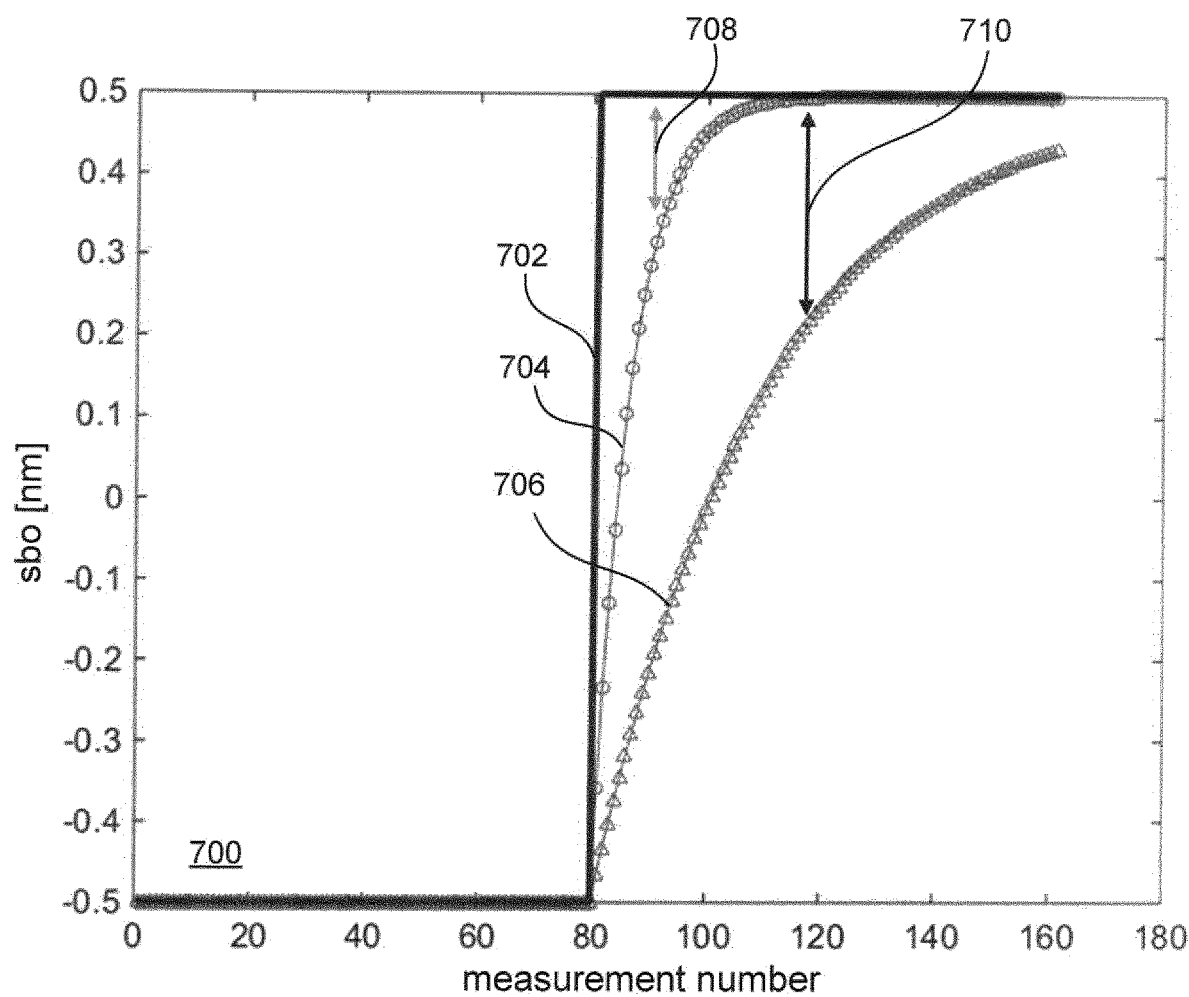
FIG. 7 shows a graph of a simulated progression of inline shift between orders (ISBO) measurements and the response of two exponential filters, according to an exemplary embodiment.

FIG. 7 shows a graph 700 of a simulated progression of ISBO measurements and the response of two exponential filters, according to an exemplary embodiment. The vertical axis of graph 700 represents an SBO in an example scale (non-limiting) of a metrology system. Said metrology system can be used, for example, to inspect results of a lithographic process. Plot line 702 represents a simulated ISBO progression, the ISBO progression comprising a step. The step is intended to simulate a sudden and substantial systematic offset (e.g., drift). The horizontal axis of graph 700 represents a measurement iteration or instance (e.g., a tracking index n).

Simulated ISBO 702 steps up between measurement 80 to 81. Plot lines 704 and 706 represent the responses of exponential filters to simulated ISBO 702. Exponential filter responses 704 and 706 use EQN. 1 and are respectively set to N=13 and N=60. Exponential filter response 704 (N=13) shows a delayed response to the SBO jump of simulated ISBO 702. Residual 708 (e.g., discrepancy, error) represents a difference between simulated ISBO 702 and exponential filter response 704 at a given measurement instance.

The symbol "E" can be used in mathematical expressions herein to represent a residual. It can be seen that it takes approximately 30-40 measurements, from the instance of the step, for exponential filter response 704 (N=13) to substantially reduce residual 708. Exponential filter response 706 (N=60) shows an even slower response, illustrated by residual 710. Residual 710 represents a difference between simulated ISBO 702 and exponential filter response 706. An exponential filter having such a delayed response to a systematic offset is undesirable for maintaining accuracy of metrology systems.

To counteract this delay, the value of N may be reduced. However, as mentioned before, reducing N has the undesirable effect of causing the filter to closely track the noise in measurements.

Figure 8:
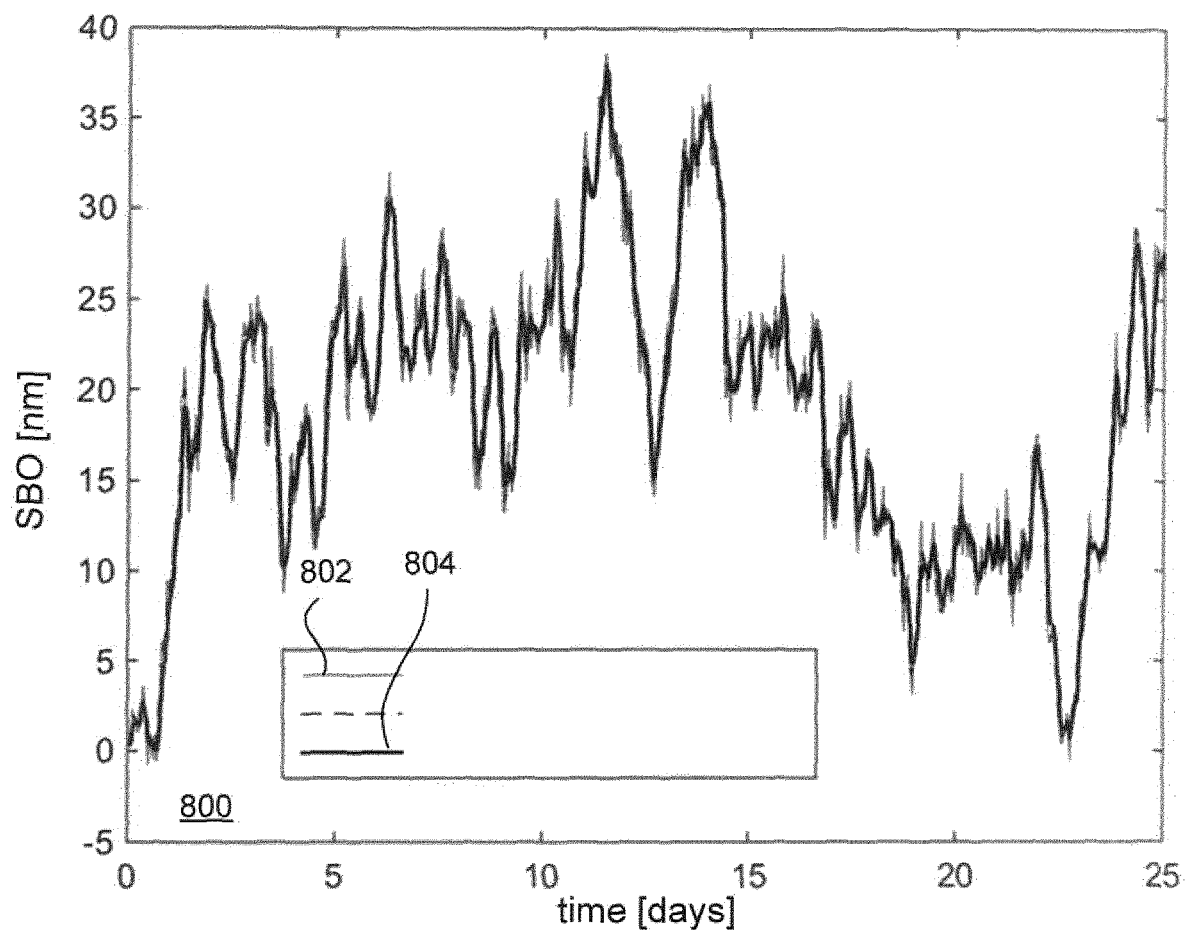
FIG. 8 shows a graph of simulated step progression of ISBO measurements and the response of an exponential filter, according to an exemplary embodiment.

FIG. 8 shows a graph 800 of simulated progression of ISBO measurements and the response of an exponential filter, according to an exemplary embodiment. The vertical axis in graph 800 represents an SBO in an example scale (non-limiting) for a metrology system. Plot line 802 represents a simulated ISBO progression comprising a random walk. The random walk is intended to simulate a more realistic systematic drift than the step portrayed by simulated ISBO 702 (FIG. 7). The horizontal axis of graph 800 represents time. Simulated ISBO 802 simulates ISBO measurements taken at regular time intervals. The dashed plot line represents a moving average of simulated ISBO 802. Plot line 804 represents the response of an exponential filter (e.g., EQN. 1) having a low N (N=3). It can be seen that a low N causes exponential filter 804 to closely track the random walk (e.g., noise) of simulated ISBO 802, which is undesirable. Finding an optimum value of N for an ISBO filter can be problematic because a large N introduces error due to filter lag, whereas a small N can cause the filter to track measurement noise rather than mitigate its effects.

Embodiments in the present disclosure provide methods and apparatuses that address this problem. In some embodiments, the exponential filter of EQN. 1 is modified to include an error term as follows:

$$y_n = (1-\alpha) y_{n-1} + \alpha x_n - \beta \varepsilon_{n-1}. \quad (2)$$

In EQN. 2, the coefficient $\beta$ is adjustable (e.g., knob). The newly introduced term, $\varepsilon_{n-1}$, is an error (e.g., residual) of a measurement immediately prior to the $n^{th}$ measurement. The prior error $\varepsilon_{n-1}$ is defined as $\varepsilon_{n-1} = y_{n-1} - x_{n-1}$. In some embodiments, the error is analogous to residuals 708 and 710 in FIG. 7. The other quantities in EQN. 2 use the same definitions as those used in EQN. 1.

Figure 9:
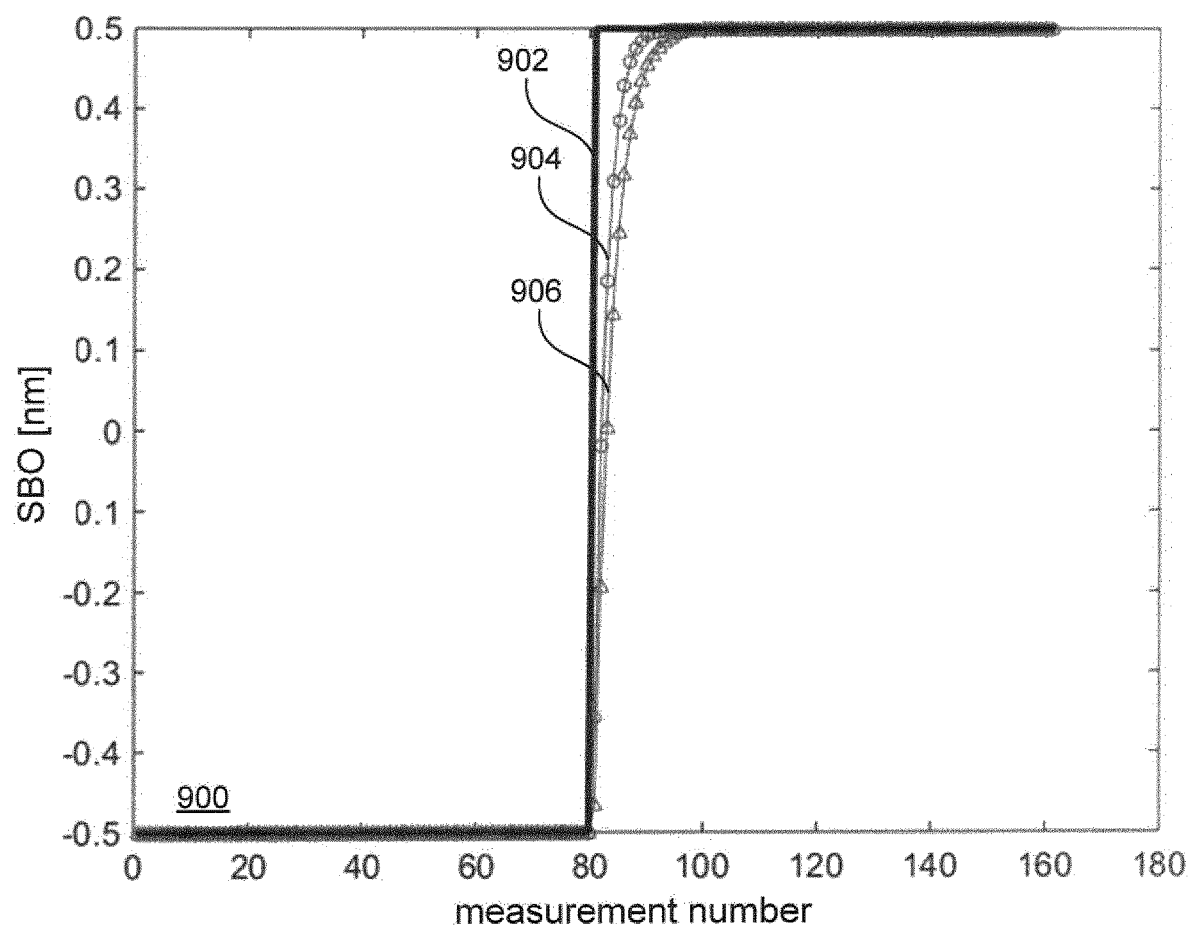
FIG. 9 shows a graph of a simulated progression of ISBO measurements representative of a practical system and the response of two modified filters, according to an exemplary embodiment.

FIG. 9 shows a graph 900 of a simulated progression of ISBO measurements representative of a practical system and the response of two modified filters, according to an exemplary embodiment. To facilitate comparison and discern differences, graph 900 uses the same axes, scale, and simulated ISBO progression (e.g., step) as those used in FIG. 7. Plot line 902 represents the simulated ISBO progression.

Plot lines 904 and 906 represent the responses of modified filters to simulated ISBO 902. Modified filter responses 904 and 906 use EQN. 2 and are respectively set to N=13 and N=60, and both are set to β=0.25. Modified filter response 904 (N=13) shows a much reduced delay of the response to the SBO jump of simulated ISBO 902, as compared to exponential filter response 704 (FIG. 7).

The difference is even more pronounced for modified filter response 906 (N=60), as compared to exponential filter response 706 (FIG. 7). Previously, exponential filter response 706 was not able to reduce the gap (i.e., residual 710) even after 80 measurements from the moment of the step. Yet now, it can be seen that modified filter response 906 is able to substantially close the gap in less than approximately 20 measurement iterations.

Figure 10:
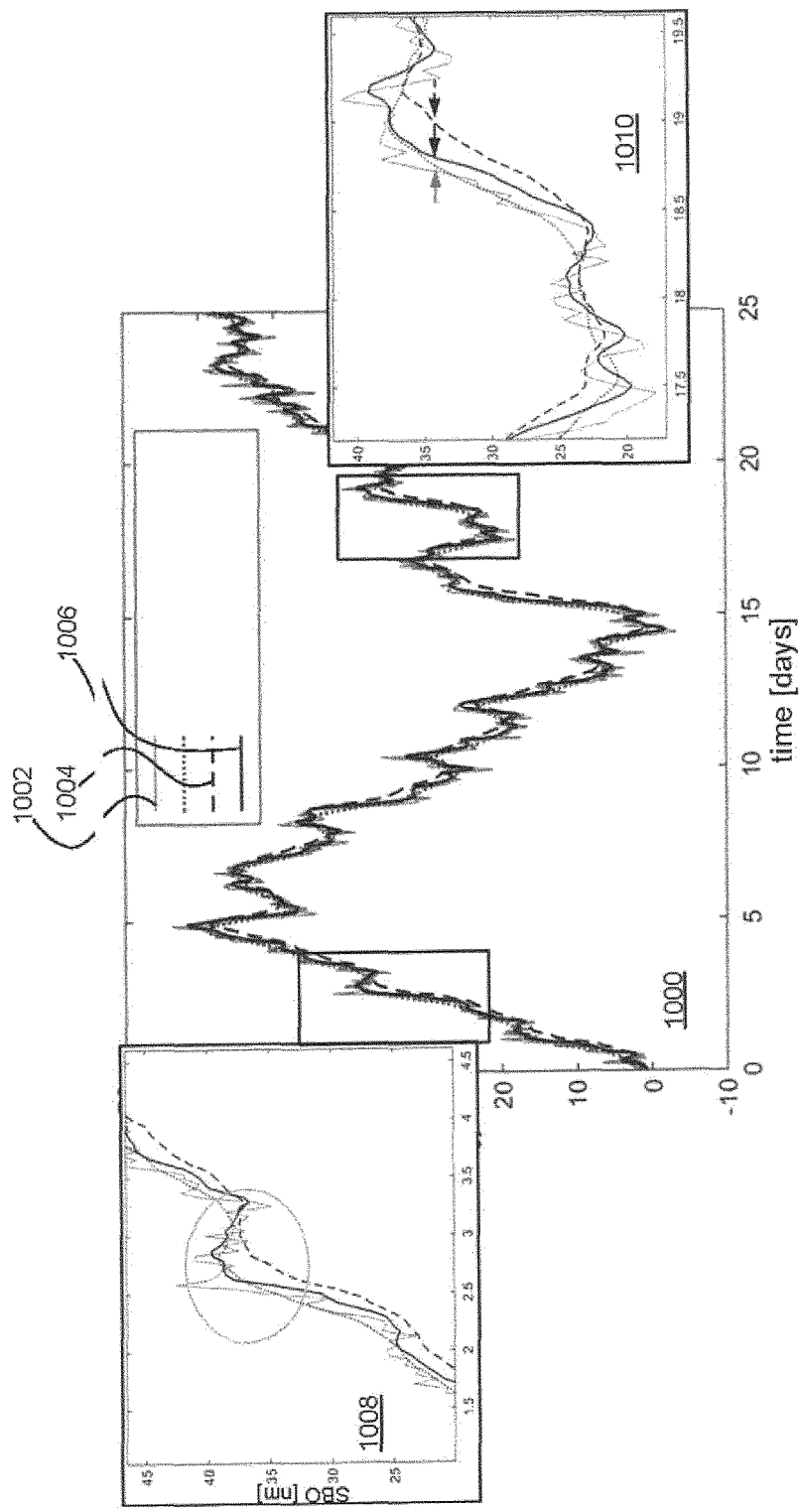
FIG. 10 shows a graph of simulated progression of ISBO measurements representative of a practical system and the response of a modified filter, and compares it with the response of an exponential filter, according to an exemplary embodiment.

FIG. 10 shows a graph 1000 of simulated progression of ISBO measurements representative of a practical system and the response of a modified filter, and compares it with the response of an exponential filter, according to an exemplary embodiment. To facilitate comparison and discern improvements, graph 1000 uses the same axes (slightly different scale) and similar simulated ISBO progression (e.g., random walk) as those used in FIG. 8. Plot line 1002 represents the simulated ISBO progression comprising the random walk. The random walk is intended to simulate a more realistic systematic drift than the step portrayed in simulated ISBO 902 (FIG. 9). Simulated ISBO 1002 simulates ISBO measurements taken at regular time intervals. The dotted plot line represents a moving average of simulated ISBO 1002. Plot line 1004 represents the response of an exponential filter (e.g., EQN. 1) having a setting of N=13. Plot line 1006 represents the response of a modified filter (e.g., EQN. 2) having a setting of N=13 and β=0.25. For clarity, insets 1008 and 1010 magnify the indicated respective portions of graph 1000. It is observed in insets 1008 and 1010 that the modified filter is able to track simulated noisy drift as fast as it happens by reducing filter lag. For example, the circle-emphasized portion of inset 1008 shows that the modified filter (solid black plot line 1006) responds quickly while also suppressing noise. Insets 1008 and 1010 also show that the exponential filter lags considerably behind the modified filter and the simulated noisy drift, as emphasized by the arrows in inset 1010.

The modified filter (e.g., EQN. 2) is also able to reduce residual error.

Figure 11:
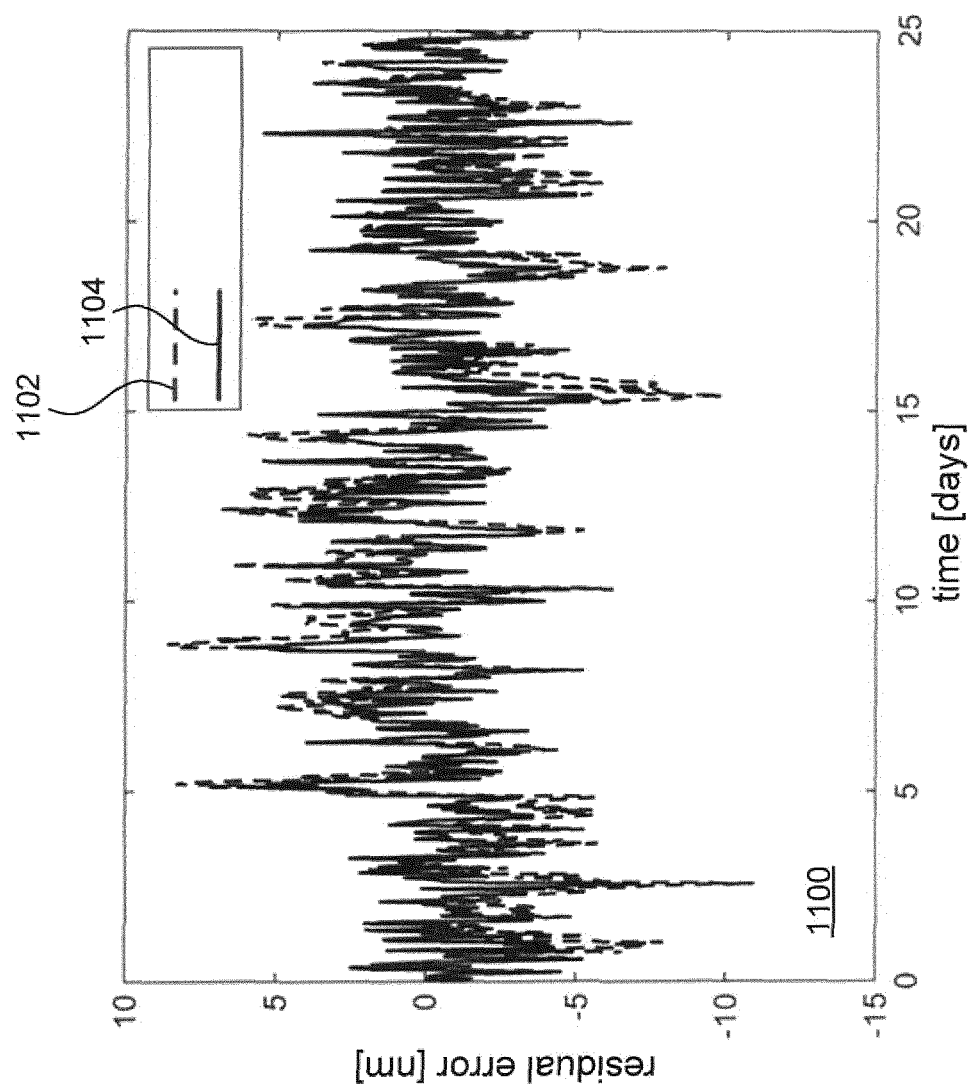
FIG. 11 shows a graph of residual error for the filter data presented in FIG. 10, according to an exemplary embodiment.

FIG. 11 shows a graph 1100 of exemplary residual error for the filter data that was presented in FIG. 10. Plot line 1102 shows the residual error (e.g., $\varepsilon_n = y_n - x_n$) of the data corresponding to the exponential filter in FIG. 10. Similarly, plot line 1104 shows the residual error of the data corresponding to the modified filter in FIG. 10. By using the data of FIG. 11 to create histograms of the residual errors, statistical analysis of the residual error can be performed.

Figure 12:
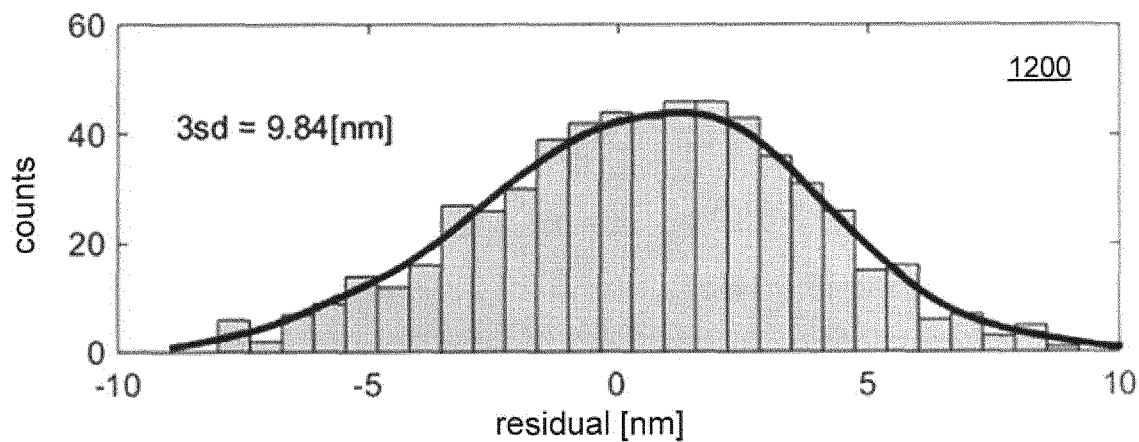
FIG. 12 shows a histogram of residual error resulting from an implementation of an exponential filter.
Figure 13:
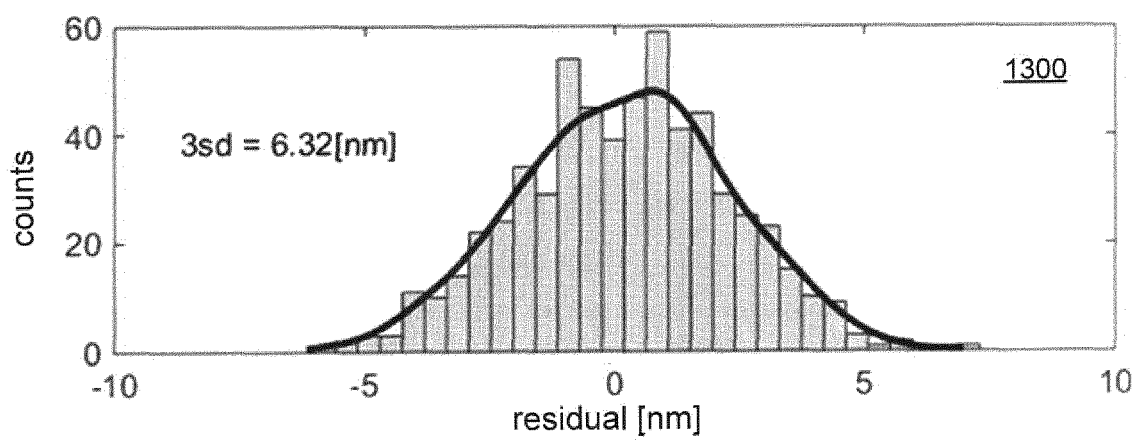
FIG. 13 shows a histogram of residual error resulting from an implementation of a modified filter.

FIGS. 12 and 13 show exemplary histograms 1200 and 1300 of the residual error resulting from implementations of exponential and modified filters, respectively. It is shown that the exponential filter, in its tracking of the noisy signal in FIG. 10, produced a 3σ distribution (e.g., 3 standard deviations) of 9.84 nm, whereas the modified filter reduces 3σ to 6.32 nm—a 36% reduction.

When the filters are applied to actual measurements, rather than simulation, the difference in each of the filter's performances are consistent with the behavior seen in FIGS. 7-13.

Figure 14:
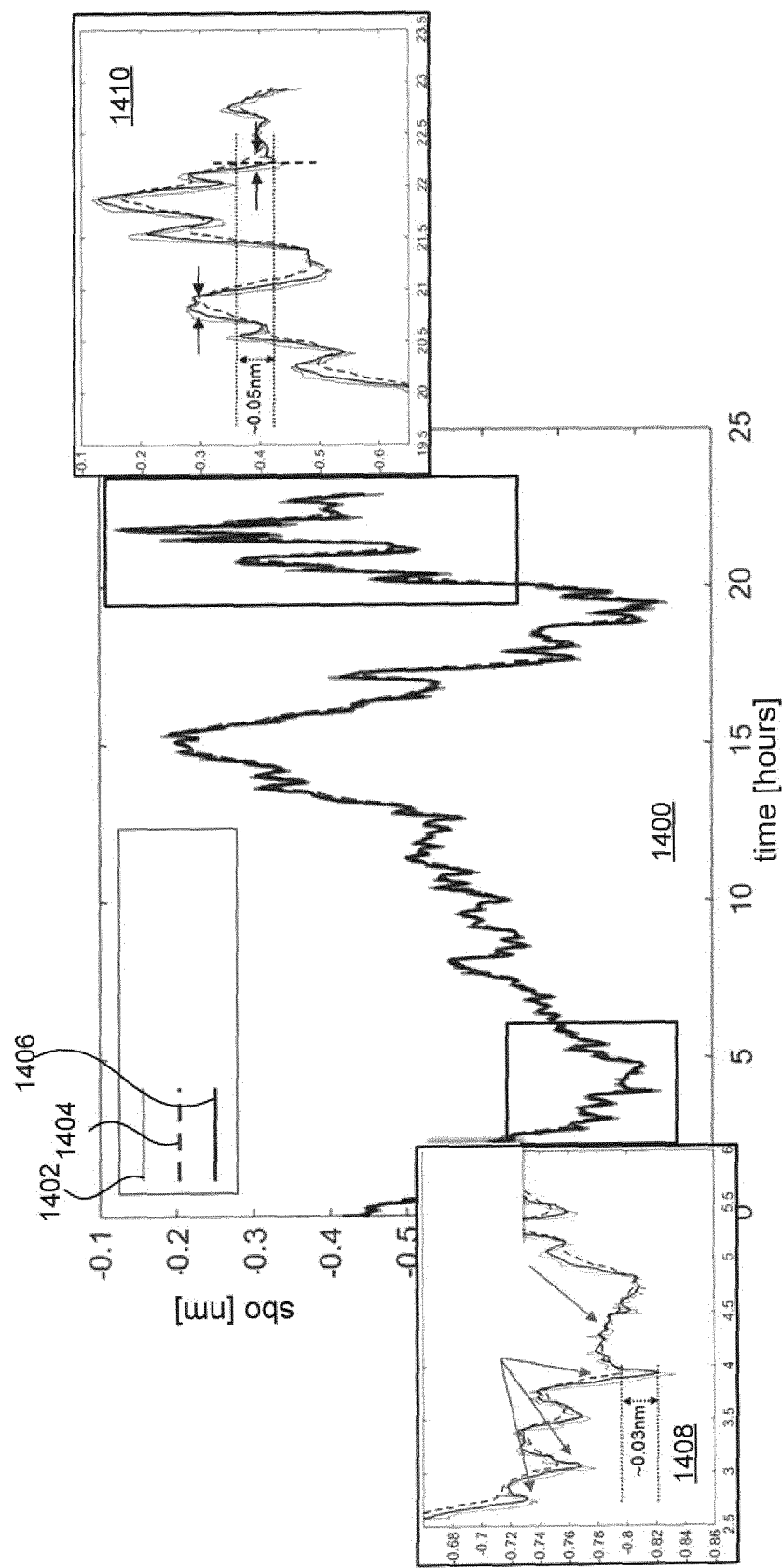
FIG. 14 shows a graph of actual ISBO measurements and the response of exponential and modified filters, according to an exemplary embodiment.
Figure 15:
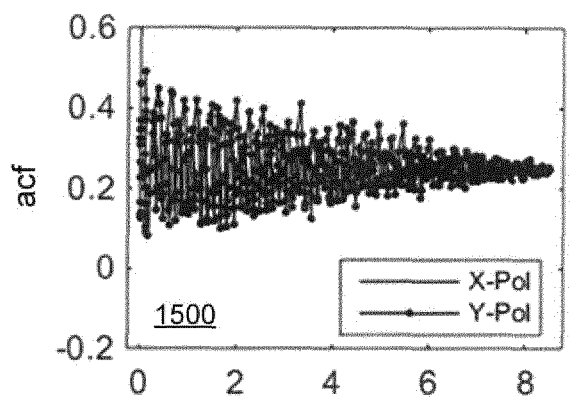
FIGS. 15-18 show graphs of sample autocorrelation plotted versus sample lag for sets of actual ISBO measurements, according to exemplary embodiments.
Figure 16:
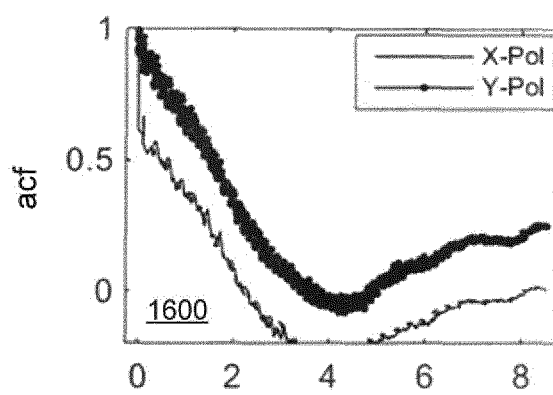
Figure 17:
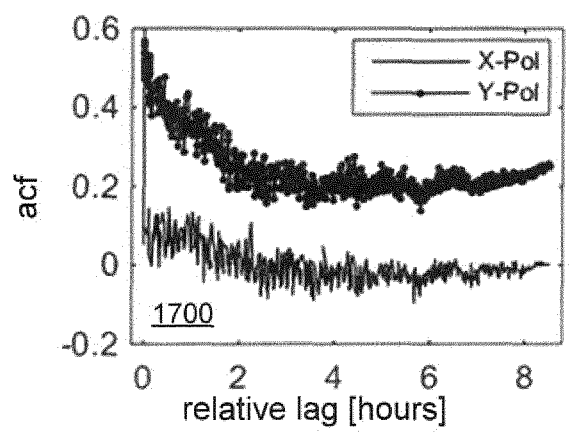
Figure 18:
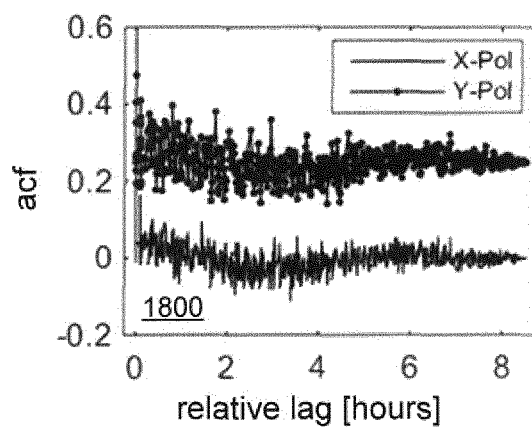
Figure 19:
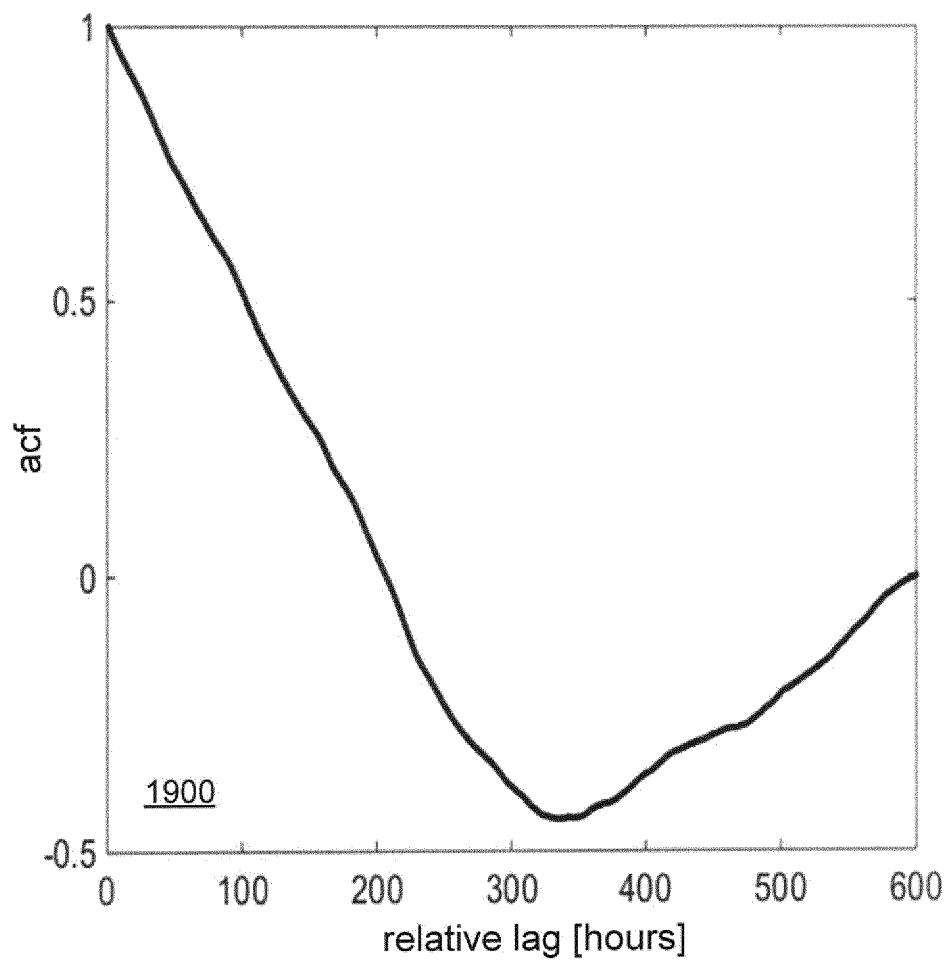
FIG. 19 shows a graph of sample autocorrelation plotted versus sample lag for simulated ISBO measurements, according to exemplary embodiments.
Figure 20:
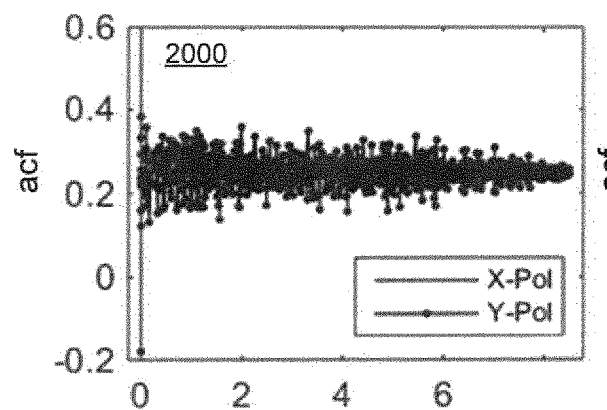
FIGS. 20-23 show graphs of autocorrelation of $1^{st}$ differences derived from data presented in FIGS. 15-18, according to exemplary embodiments.
Figure 21:
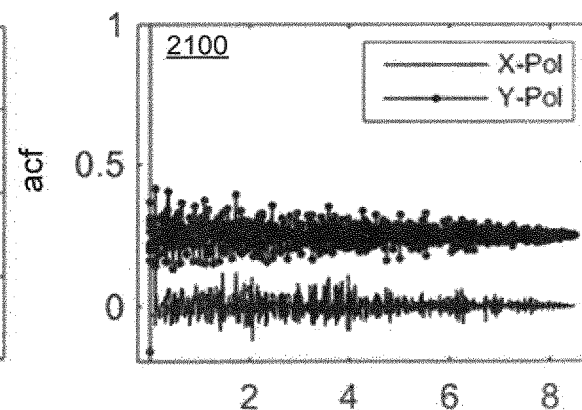
Figure 22:
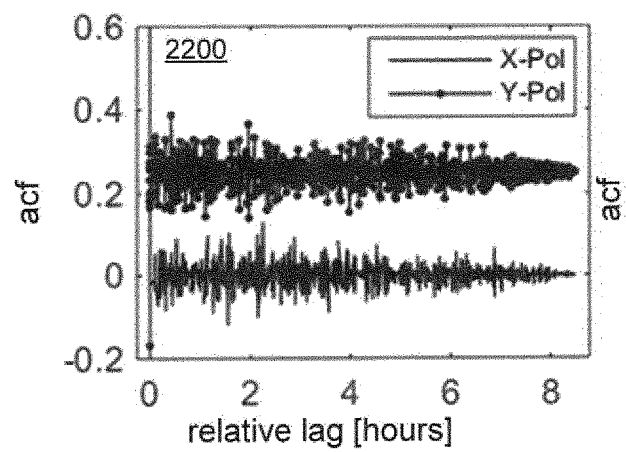
Figure 23:
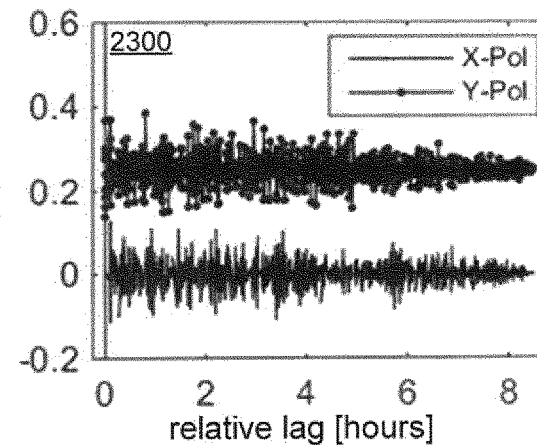
Figure 24:
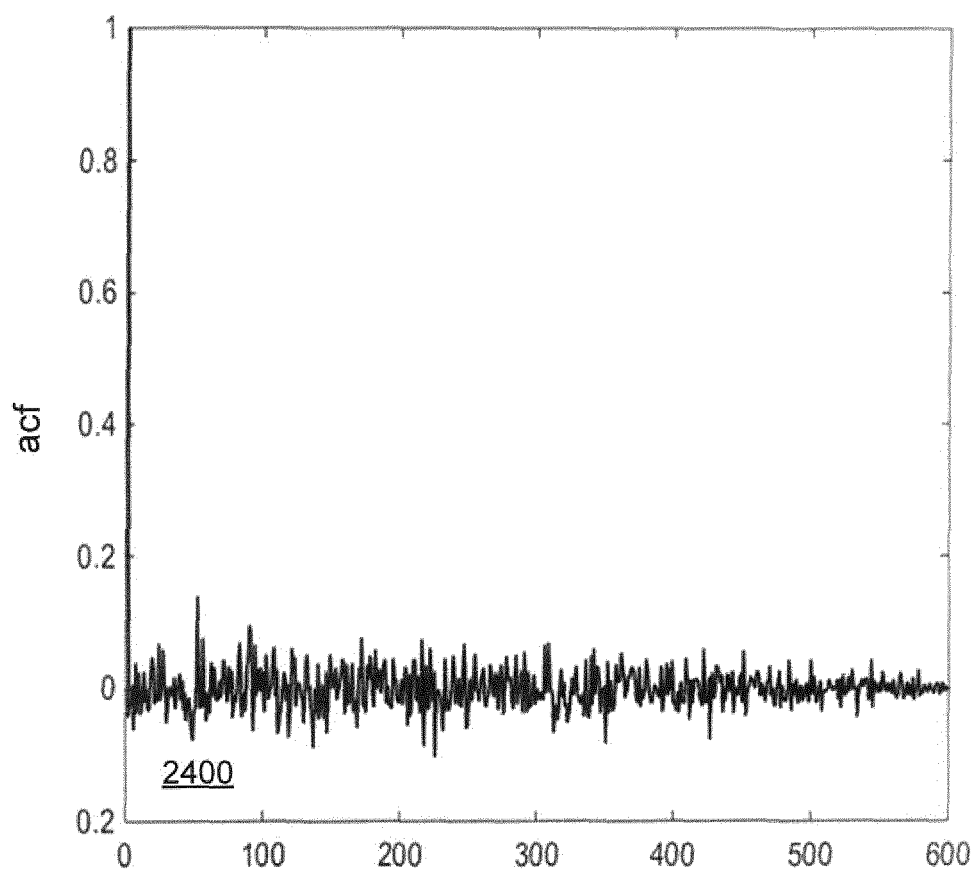
FIG. 24 shows a graph of autocorrelation of $1^{st}$ differences derived from data presented in FIG. 19, according to an exemplary embodiment.

FIG. 14 shows a graph 1400 of actual measurements and the response of exponential and modified filters, according to an exemplary embodiment. To facilitate comparison and discern differences, graph 1400 uses the same axes (slightly different scale) as those used in FIGS. 8 and 10.

Plot line 1402 represents actual ISBO measurements performed by a metrology system for a lithographic apparatus. ISBO measurements 1402 were taken at regular time intervals over a period of 24 hours. Plot line 1404 represents the response of an exponential filter (e.g., EQN. 1) having a setting of N=13. Plot line 1406 represents the response of a modified filter (e.g., EQN. 2) having a setting of N=13 and β=0.25.

For clarity, insets 1408 and 1410 magnify the indicated respective portions of graph 1400. It is observed in insets 1408 and 1410 that the modified filter is able to track simulated noisy drift as fast as it happens by reducing filter lag. Inset 1408 shows that the modified filter is able to track fast and large drifts while at the same time suppressing measurement noise. The inset 1408 also shows improvement of ~0.03 nm with the ability to track faster. Similarly, inset 1410 shows that the modified filter reduces estimation error due to filter lag when the drifts are fast and substantial. An improvement of ~0.05 nm in tracking error can be observed in inset 1410. It is expected that the modified filter will benefit metrology systems known to have poorer precision and stability, as these systems require higher N values to compensate for higher noise. This expectation is justified by comparing the improvements between FIGS. 7 and 9, which show a remarkable reduction of filter response delay and residual for the N=60 setting.

A skilled artisan may investigate whether (1) a random walk simulation correlates to real-world improvements and (2) higher order error terms (e.g., further in the past) can be used to improve the modified filter since FIGS. 7-14 all show differences of a modified filter that uses only one error term of the immediate past (e.g., $\varepsilon_{n-1}$).

In one example, autocorrelation and sample differentiation technique can be used. FIGS. 15-19 respectively show graphs 1500, 1600, 1700, 1800, and 1900 of sample autocorrelation plotted versus sample lag, for a new set of actual or simulated ISBO measurements, according to exemplary embodiments.

Graph 1500 corresponds to actual measurements made by an optical channel that uses radiation having a red wavelength (e.g., 635 nm±3 nm) and both X and Y polarizations. Graph 1600 is similar to graph 1500, but radiation having green wavelength (e.g., 532 nm±50 pm) is used. Graph 1700 is similar to graph 1500, but radiation having near-infrared (NIR) wavelength (e.g., 780 nm±10 nm) is used. Graph 1800 is similar to graph 1500, but radiation having far-infrared (FIR) wavelength (e.g., 838 nm±10 nm) is used. Graph 1900 corresponds to the simulated ISBO measurements (wavelength and polarization are arbitrary). The horizontal axis in graph 1900 is an arbitrary time scale with ISBO measurements performed at regular intervals. For clarity, in graphs 1500, 1600, 1700, and 1800, the X and Y polarizations have been artificially offset vertically by 0.25 nm.

Then, a first derivative (numerical) is taken for each data set represented in FIGS. 15-19. Finally, the autocorrelation of the $1^{st}$ differences in the data is computed. FIGS. 20-24 respectively show said autocorrelation (e.g., vertical axes) derived from the data in FIGS. 15-19.

The horizontal axes in FIGS. 20-24 are the same as in FIGS. 15-19, respectively. It is seen in FIGS. 20-24 that the $1^{st}$ differences of data 'flatten' the autocorrelation for all lags greater than 1 sample. This characteristic is seen in both actual and simulated ISBO datasets.

Taken altogether, FIGS. 15-24 show that the random walk (e.g., simulated) model statistically captures the key characteristics of the system drift seen in the measured data. This validates the random walk model as appropriate for emulating system drift. Also, the $1^{st}$ differences are enough to make the data 'stationary' (e.g., flattening of plotted data) and independent and identically distributed. This suggests that the design of the exponential and modified filters, which use only one step of lag (e.g., $y_{n-1}$ and $\varepsilon_{n-1}$), is optimal or substantially optimal. That is, values further in the past beyond one sample (e.g., $\varepsilon_{n-2}$) may not provide substantial noise and filter delay reduction over using just the one sample in the immediate past.

In addition to noise and delay reduction, embodiments of the disclosure herein can provide other results.

For one, the exponential filter of EQN. 1 is a linear system. The modified filter of EQN. 2 is a linear extension of that linear system. One of the results of linear systems is that it is possible to prove their stability. In the context of linear/non-linear systems, stability can be understood as a propensity for the system to converge on a desired outcome (e.g., the 'true' drift).

Conversely, non-linear systems are difficult to understand, but for a number of special cases. Non-linear systems can be described as those that vary in behavior depending on input values being within (or outside) a threshold value. Proving stability of a non-linear system is a daunting, and often impossible, task. The mere possibility that a non-linear system could produce a divergent result from a desired outcome imposes a risk, possibly ruining numerous batches of processed substrates. Thus, embodiments of the disclosure herein offer a higher degree of certainty of improving lithographic processes, over non-linear methods.

Implementation of Inline Shift Between Orders

For simplicity, herein, an $[n-1]^{th}$ instance of a measurement can be referred to as a 'first' instance (e.g., a first measurement). Correspondingly, $n^{th}$ instance of a measurement can be referred to as a 'second' instance (e.g., a second measurement).

Figure 25:
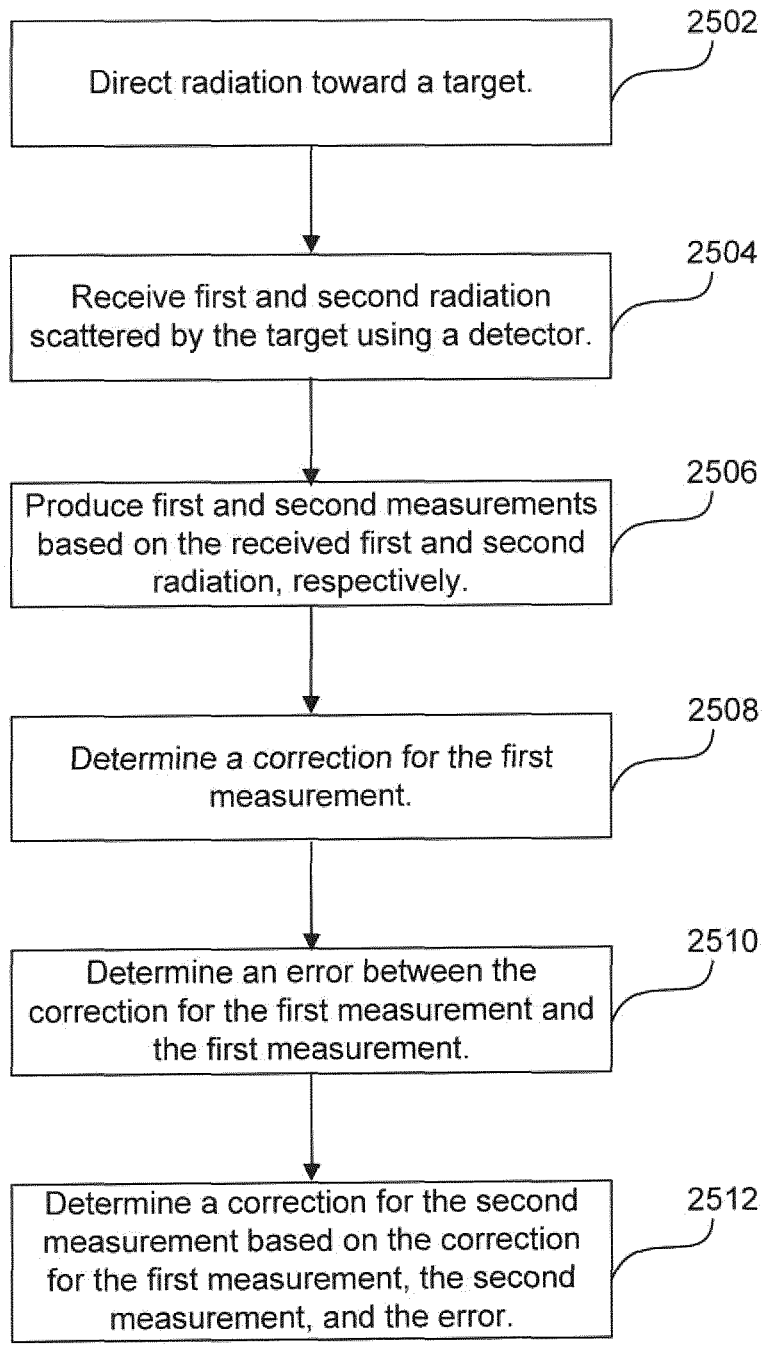
FIG. 25 shows example method steps that may be performed by lithographic apparatus or metrology system, according to an exemplary embodiment.

FIG. 25 shows method steps for calibrating a metrology system comprises, according to an exemplary embodiment. In step 2502, radiation is directed toward a target. In step 2504, first and second radiation scattered by the target is received using a detector. In step 2506, a first and second measurement are produced based on the received first and second radiation, respectively. In step 2508, a correction for the first measurement is determined. In step 2510, error between the correction for the first measurement and the first measurement is determined. In step 2512, a correction for the second measurement is determined based on the correction for the first measurement, the second measurement, and the error.

In some embodiments, the error is the difference between the first correction and the first measurement. The first coefficient is based on a delay constant. The correction for the second measurement is further based on the second measurement combined with the correction for the first measurement and a difference with the error. The correction for the second measurement is yet further based on using a first coefficient to modify the correction for the first measurement and the second measurement, and using a second coefficient to modify the error.

In some embodiments, the metrology system comprises a substrate stage and the target is a fiducial of the substrate stage. The correction for the second measurement offsets a drift of the metrology system. The correction for the second measurement is applied to a subsequent measurement of another target.

In some embodiments, the above-mentioned operations can be executed by appropriate hardware (e.g., processor, controller). The processor or controller may be a part of a metrology system. In some embodiments, the metrology system may be a part of a lithographic apparatus or cluster.

The embodiments may further be described using the following clauses:

1. A lithographic apparatus comprising:
   an illumination system configured to illuminate a pattern of a patterning device;
   a projection system configured to project an image of the pattern onto a substrate; and
   a metrology system comprising:
   a radiation source configured to generate radiation;
   an optical element configured to direct the radiation toward a target;
   a detector configured to receive a first and second radiation scattered by the target and produce a first and second measurement respectively based on the received first and second radiation; and
   a controller configured to
   determine a correction for the first measurement,
   determine an error between the correction for the first measurement and the first measurement, and
   determine a correction for the second measurement based on the correction for the first measurement, the second measurement, and the error, whereby the lithographic apparatus uses the correction in a subsequent lithographic process to adjust a position of the substrate.

2. The lithographic apparatus of clause 1, wherein the error is the difference between the correction for the first measurement and the first measurement.

3. The lithographic apparatus of clause 1, wherein the correction for the second measurement is further based on the second measurement combined with the correction for the first measurement and a difference with the error.

4. The lithographic apparatus of clause 1, wherein the correction for the second measurement is further based on using a first coefficient to modify the correction for the first measurement and the second measurement, and using a second coefficient to modify the error.

5. The lithographic apparatus of clause 1, further comprising a substrate stage, wherein the target is a fiducial of the substrate stage.

6. The lithographic apparatus of clause 1, wherein the correction for the second measurement offsets a drift of the metrology system.

7. The lithographic apparatus of clause 1, wherein the correction for the second measurement is applied to a subsequent measurement of a target on the substrate.

8. The lithographic apparatus of clause 1, wherein the first coefficient is based on a delay constant.

9. A metrology system comprising:
   a radiation source configured to generate radiation;
   an optical element configured to direct the radiation toward a target;
   a detector configured to receive a first and second radiation scattered by the target and produce a first and second measurement respectively based on the received first and second radiation; and
   a controller configured to
   determine a correction for the first measurement,
   determine an error between the correction for the first measurement and the first measurement, and determine a correction for the second measurement based on the correction for the first measurement, the second measurement, and the error, whereby the lithographic apparatus uses the correction in a subsequent lithographic process to adjust a position of a substrate.

10. The metrology system of clause 9, wherein the error is the difference between the correction for the first measurement and the first measurement.

11. The metrology system of clause 9, wherein the correction for the second measurement is further based on the second measurement combined with the correction for the first measurement and a difference with the error.

12. The metrology system of clause 9, wherein the correction for the second measurement is further based on using a first coefficient to modify the correction for the first measurement and the second measurement, and using a second coefficient to modify the error.

13. The metrology system of clause 9, further comprising a substrate stage, wherein the target is a fiducial of the substrate stage.

14. The metrology system of clause 9, wherein the correction for the second measurement offsets a drift of the metrology system.

15. The metrology system of clause 9, wherein the correction for the second correction is applied to a subsequent measurement of a target on the substrate.

16. The metrology system of clause 9, wherein the first coefficient is based on a delay constant.

17. A method of calibrating a metrology system, the method comprising:

directing radiation toward a target;

receiving a first and second radiation scattered by the target using a detector;

producing a first and second measurement respectively based on the received first and second radiation;

determining a correction for the first measurement;

determining an error between the correction for the first measurement and the first measurement; and determining a correction for the second measurement based on the correction for the first measurement, the second measurement, and the error.

18. The method of clause 17, wherein the error is the difference between the first correction and the first measurement.

19. The method of clause 17, wherein the correction for the second measurement is further based on the second measurement combined with the correction for the first measurement and a difference with the error.

20. The method of clause 17, wherein the correction for the second measurement is further based on using a first coefficient to modify the correction for the first measurement and the second measurement, and using a second coefficient to modify the error.

21. The method of clause 17, wherein the metrology system comprises a substrate stage and the target is a fiducial of the substrate stage.

22. The method of clause 17, wherein the correction for the second measurement offsets a drift of the metrology system.

23. The method of clause 17, wherein the correction for the second measurement is applied to a subsequent measurement of another target.

24. The method of clause 17, wherein the first coefficient is based on a delay constant.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Embodiments of the present disclosure can be implemented in hardware, firmware, software, or any combination thereof. Embodiments of the present disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A lithographic apparatus comprising:
   an illumination system configured to illuminate a pattern of a patterning device;
   a projection system configured to project an image of the pattern onto a substrate; and
   a metrology system comprising:
      a radiation source configured to generate radiation;
      an optical element configured to direct the radiation toward a target;
      a detector configured to receive a first radiation and a second radiation scattered by the target and to produce a corresponding first and a second measurement of the target, respectively, based on the received first and second radiation, wherein the second radiation immediately succeeds the first radiation; and
      a controller configured to:
         determine a first correction value associated with the first measurement,
         determine an error between the first correction value and the first measurement, and
         determine a second correction value associated with the second measurement based on the first correction value, the second measurement, and the error, whereby the lithographic apparatus uses the second correction value in a subsequent lithographic process to adjust a position of the substrate.

2. The lithographic apparatus of claim 1, wherein the error is the difference between the first correction value and the first measurement.

3. The lithographic apparatus of claim 1, wherein the second correction value is further based on the second measurement combined with the first correction value and a difference with the error.

4. The lithographic apparatus of claim 1, wherein the second correction value is further based on a first coefficient to modify the first correction value and the second measurement, and on a second coefficient to modify the error.

5. The lithographic apparatus of claim 1, further comprising a substrate stage, wherein the target is a fiducial of the substrate stage.

6. The lithographic apparatus of claim 1, wherein the second correction value offsets a drift of the metrology system.

7. The lithographic apparatus of claim 1, wherein the second correction value is applied to a subsequent measurement of a target on the substrate.

8. The lithographic apparatus of claim 4, wherein the first coefficient is based on a delay constant.

9. A metrology system comprising:
   a radiation source configured to generate radiation;
   an optical element configured to direct the radiation toward a target;
   a detector configured to receive a first radiation and a second radiation scattered by the target and to produce a corresponding first and a second measurement of the target, respectively, based on the received first and second radiation, wherein the second radiation immediately succeeds the first radiation; and
   a controller configured to:
      determine a first correction value associated with the first measurement,
      determine an error between the first correction value for and the first measurement, and
      determine a second correction value associated with the second measurement based on the first correction value, the second measurement, and the error, whereby the lithographic apparatus uses the second correction value in a subsequent lithographic process to adjust a position of the substrate.

10. The metrology system of claim 9, wherein the error is the difference between the first correction value for the first measurement and the first measurement.

11. The metrology system of claim 9, wherein the second correction value is further based on the second measurement combined with the first correction value and a difference with the error.

12. The metrology system of claim 9, wherein the second correction value is further based on a first coefficient to modify the first correction value and the second measurement, and on a second coefficient to modify the error.

13. The metrology system of claim 9, further comprising a substrate stage, wherein the target is a fiducial of the substrate stage.

14. The metrology system of claim 9, wherein the second correction value offsets a drift of the metrology system.

15. The metrology system of claim 9, wherein the second correction value for the second measurement is applied to a subsequent measurement of a target on the substrate.

16. The metrology system of claim 12, wherein the first coefficient is based on a delay constant.

\* \* \* \* \*